United States Patent [19]
Budde et al.

[11] Patent Number: 4,735,891
[45] Date of Patent: Apr. 5, 1988

[54] THERMALLY STABLE, IRRADIATION CROSS-LINKABLE POLYMER SYSTEMS BASED ON BISPHENOLS AND EPICHLOROHYDRIN

[75] Inventors: Klaus Budde, Unterhaching; Oskar Nuyken, Munich, both of Fed. Rep. of Germany

[73] Assignee: Siemens Aktiengesellschaft, Berlin and Munich, Fed. Rep. of Germany

[21] Appl. No.: 749,588

[22] Filed: Jun. 27, 1985

[30] Foreign Application Priority Data

Jun. 29, 1984 [DE] Fed. Rep. of Germany ....... 3424119

[51] Int. Cl.$^4$ .............................................. G03C 5/00
[52] U.S. Cl. ..................... 430/313; 430/311; 430/312; 430/324; 430/325; 430/280; 430/287; 430/286; 522/100
[58] Field of Search ............... 430/311, 313, 312, 324, 430/325, 280, 287, 286; 522/100

[56] References Cited

U.S. PATENT DOCUMENTS 3,387,976 6/1968 Sorkin ............................ 430/287 X
3,822,235 7/1974 Hunter et al. ................... 430/280 X
3,956,043 5/1976 Zahir et al. .................... 96/115 R X

FOREIGN PATENT DOCUMENTS 09213530 3/1963 United Kingdom ................ 430/280
1118213 6/1968 United Kingdom .

OTHER PUBLICATIONS

Chem. Abstracts Citation, vol. 99, Issue 4, No. 23524G.
J. March "Advanced Organic Chemistry", 2nd edition, McGraw-Hill, 1977, p. 361.
Paul Karrer, "Organic Chemistry", p. 636, Third English edition 1947, Elsevier Publishing Co., Inc., New York.

Primary Examiner—Paul R. Michl
Assistant Examiner—Cynthia Hamilton
Attorney, Agent, or Firm—Hill, Van Santen, Steadman & Simpson

[57] ABSTRACT

For shortening the exposure time of radiation-sensitive epoxy resin lacquers based on condensates of bisphenols and epichlorohydrin and for increasing their thermal stability, the number of reactive groups in each polymer repeating unit is increased by incorporating there into at least two hydroxyl groups and preferably five hydroxymethylene groups. When a composition of such a polyhydroxylated condensate is reacted with cinnamic acid chloride or the like, the resulting light sensitive condensate is utilizable as a coating in the manufacture of printed multilayer wirings. Intermediate tempering, drilling and additional protective films are eliminated. Such a condensate can also be employed in the field of integrated semiconductor circuits in VLSI technology where lacquer structures are produced.

3 Claims, 1 Drawing Sheet

THERMALLY STABLE, IRRADIATION CROSS-LINKABLE POLYMER SYSTEMS BASED ON BISPHENOLS AND EPICHLOROHYDRIN

BACKGROUND OF THE INVENTION

1. Field of the Invention

This invention lies in the field of polyhydroxylated polymers of bisphenols and epichlorohydrin, and, more particularly, of irradiation cross-linkable thermostable polymer systems having a plurality of hydroxyl groups per polymer repeating unit which groups are adapted for reaction with light responsive groups or compounds.

2. Prior Art

It is known to manufacture multilayer wirings by pressing together superimposed thin films to form laminates containing a desired corresponding conduction image by means of adhesive films interlayered between such thin films. The resulting thin film laminates form layers of insulating material between individual interconnect levels. After multilayered printed circuit boards have been produced, the line connections and contact locations between the individual layers are produced by borings and subsequent platings of these bores.

In order to avoid crack formation in the contact layer or in the intermediate layers, as well as to avoid delamination effects, when soldering, or when experiencing alternating temperature stresses, the procedure described above has been improved so that the thin film laminates are copper-laminated on both sides, and the copper films are coated with a photo sensitive (e.g. a photo resist) lacquer layer. This layer, which can be comprised either of a negative or a positive lacquer, is covered with a selected corresponding mask, then imaged (exposed), and developed. The remaining, developed portions of such a resin layer serve as sites which protect the underlying copper in a subsequent etching operation of the exposed copper. Thus, a desired conductive pattern arises after the removal of the copper by etching, while the photo imaged and developed resist lacquer layer adheres to the copper layer. The lacquer residue layers are removed thereafter either with organic solvents or mechanically, and a next layer is then applied thereover.

In order to avoid damage to the surface of the synthetic resin layer needed for the building up of the laminates, particularly the damage caused in the removal of the synthetic resin, German patent application DE-PS No. 23 42 407 proposes the employment of an organic material as a light-sensitive material which contains a compound with epoxide groups and with groups hardenable upon exposure to electromagnetic radiation. The resin should contain about two epoxide groups per molecule. The parts of the light-sensitive layer which are pre-hardened by such a radiation exposure are subjected to a thermal aftertreatment utilizing a heat-activatable hardener for epoxy resins, and, accordingly, such parts are left on the carrier film. The pressing together of the individually coated and treated carrier films is executed upon interposition of adhesive films between adjacent such carrier films. The adhesive films are comprised of a glass fabric impregnated with an epoxy resin and a hardener for the epoxy resin. It is thus of significance that the cross-linking of the resin existing after such an exposure has not progressed to such a degree that the resultant lacquer has become completely insoluble and unmeltable. Hence, the epoxide groups remaining in the lacquer layer are available to enter into a cross-linking reaction in a later pressing of a layer of such resin to a further ply of adhesive film, or, alternatively, of, pre-preg (i.e. a glass fiber fabric pre-impregnated with resin, or a film comprised of a cross-linkable resin without glass fiber reinforcement). In the epoxy resin employed for the composition of this material, in such a later pressing, there must be present an adequate number of reactable groups for achieving a substantially complete cross-linking of the epoxide groups present in the resist lacquer.

BRIEF SUMMARY OF THE INVENTION

More particularly, the present invention relates to a thermostable polymer system based on a condensate of bisphenol and epichlorohydrin which condensate has at least two reactive hydroxyl groups present in each repeating unit, and which polymer system is cross-linkable by irradiation, particularly optical radiation.

The polymer system is produced by reacting the hydroxyl groups of the condensate with/to light responsive compounds. After the reaction, the resulting resin (polymer) is cross-linkable by irradiation. After irradiation the resin is cross-linked and thermostable.

The invention also relates to a method for using such a system in the manufacture of printed multilayered wiring systems, and to the multilayer circuits made thereby.

The invention further relates to a method for using such a system for producing lacquer structures of the type employed in the manufacture of integrated semiconductor circuits in very large scale integration (VLSI)) technology.

Primary objects of the present invention are to provide a polymer system of the bisphenol/epichlorohydrin type which:

(a) significantly simplifies the manufacture of printed multilayer wirings in comparison to methods hitherto known, (b) allows the manufacture of dimensionally true structures, and, therefore, also comes into consideration for employment in the manufacture of integrated semiconductor structures in VLSI technology, and (c) first and foremost, creates the possibility of shortening the exposure time required in the structure formation process.

Such objects are inventively achieved herein by utilizing a polymer of this indicated type which has at least two reactive hydroxyl groups in each polymer repeating unit. Such a polymer can then be reacted or converted into a polymer which is light sensitive and thus adapted for photo imaging in a brief exposure period. Imaging by exposure to light radiation yields a cross-linked thermostable polymer, which, after subsequent development, leaves a film residue in the exposed areas. Otherwise, if desired, it is possible to achieve a limited cross-linking of the polymer by short exposure to irradiation, which, after developing, can be radiation cured.

The present polymers utilize epoxide groups at the end of the polymer chain instead of phenylic derivatives as in the teachings of DE OS No. 3,230,560.

Other and further aims, objects, features, purposes, advantages, uses, and the like for the present invention will be apparent to those skilled in the art from the present specification taken together with the drawings.

BRIEF DESCRIPTION OF DRAWINGS

In the drawings:

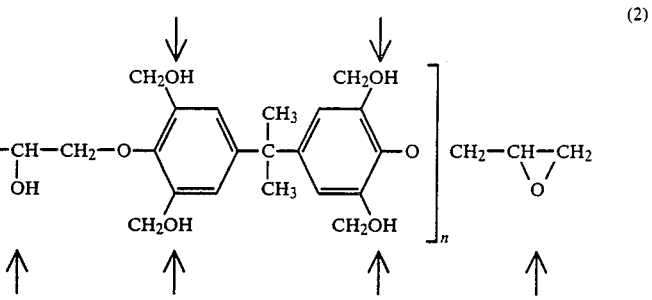

(2)

Figure 1:
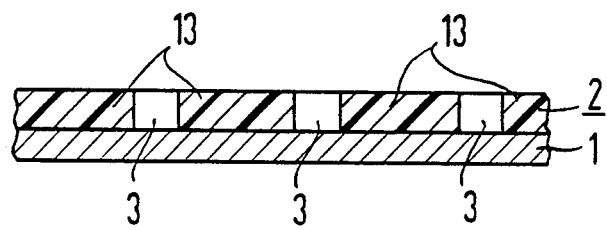
Figure 2:
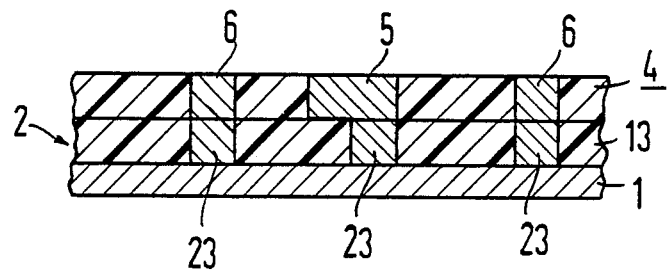

FIG. 1 is an enlarged fragmentary vertical cross sectional view taken through a laminate of copper foil and an adhering layer of an initially photo sensitive and cross-linkable polymeric composition which in the embodiment shown has already been imaged and developed in accord with teachings of this invention; and FIG. 2 is a view similar to FIG. 1 but with an additional layer of such a polymeric composition applied over the initial layer, such additional layer having been processed similarly to the layer of FIG. 1.

DETAILED DESCRIPTION (a) Resin Preparation and Structure

In a given polymer structure of the present invention, each repeating unit contains at least two and up to and including five hydroxyl groups per repeating unit. Preferably five reactive hydroxyl groups are present in each repeating unit located so that one hydroxyl group is bonded to the residual epichlorohydrin radical present in each repeating unit, and the remaining four hydroxyl groups are bonded to the residual bisphenol radical present in each repeating unit.

Proceeding from the chemical structure of a prior art epoxy resin based on bisphenol A and epichlorohydrin which is represented by the formula:

resin or polymer of the present invention is derived, which is represented by the following formula for a preferred and exemplary embodiment thereof:

wherein n is a positive whole number which ranges from 0 to about 30 (n here preferably ranges from about 10 to 25), and wherein the vertical arrows again indicate the reactive groups. In such exemplary embodiment in each repeating unit, four reactive hydroxyl groups are substituted on the residual bisphenol radical as hydroxymethylene radicals. In such condensate there are present terminal reactive epoxide groups (known from DE-PS No. 23 42 407), and there is also present, in each repeating unit, a hydroxyl group bonded to the residual epichlorohydrin radical. The four hydroxymethylene groups are inventively bonded to the residual bisphenol radical in the 3, 5, 3', and 5' positions in each repeating unit.

When such a formula (2) resin condensate compound is reacted with a light sensitive compound, such as, for example, cinnamoyl chloride, which, as will be recalled, is represented by the formula:

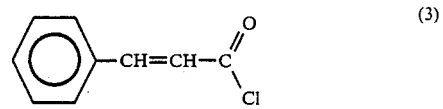

(3)

these five hydroxyl groups can react to produce a sub-

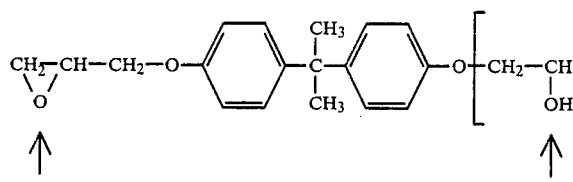

(1)

wherein n is a positive whole number which ranges typically from 0 to about 30, (n preferably ranges from about 15 to 25), and wherein the vertical arrows indicate the reactive groups, the chemical structure of a stituted resin compound of the present invention which is represented by the following formula:

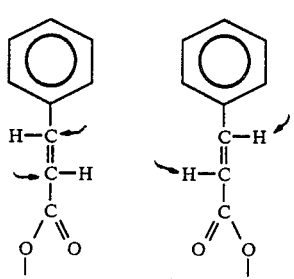

(4)

-continued

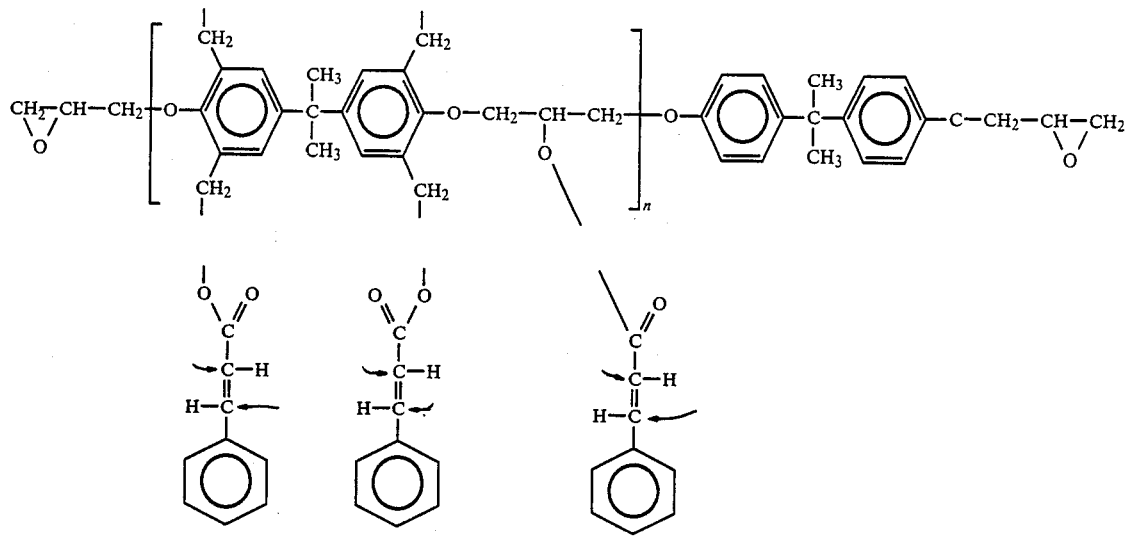

wherein n remains as above defined in relation to formula (2). In formula (4), the curved arrows indicate the reactive groups available for cross-linking by irradiation. Also in formula (4), the reaction product produced by reaction with cinnamoyl chloride is shown for only the repeating unit for the sake of simplicity. Compounds of formula (4) (e.g.) are sensitive to light. It is theorized that exposure of a compound of formula (4) to light results in the interaction of the cinnamoyl groups to produce cyclobutane derivatives, although there is no intent herein to be bound by theory. See, for example, Paul Karrer, "Organic Chemistry" p. 636 Third English edition, 1947, Elsevier Publishing Co. Inc., New York.

Instead of cinnamoyl chloride, a compound such as furfuryl acryloyl chloride can also be employed for reaction with the hydroxyl groups. As will be recalled, furfuryl acryloyl chloride has the structure:

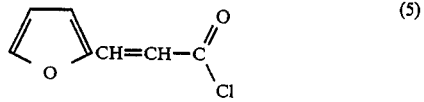 (5)

Photo reactive (e.g. light responsive or light sensitive) furfuryl acrylic acid derivatives then arise, as desired.

A presently preferred class of resin condensate compounds of the present invention (which includes the resin condensate compounds of formula (2) above) is represented by the generic formula:

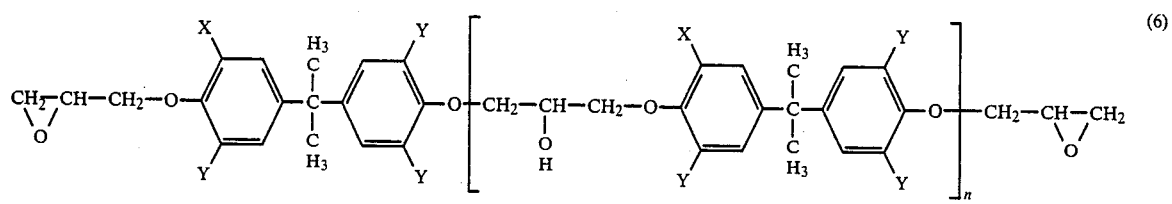 (6)

where:
n is as above defined in formula (2),
X is a radical selected from the group consisting of hydroxymethylene and radicals of the structure:

Y is a radical selected from the group consisting of hydrogen, hydroxymethylene, and radicals of the structure:

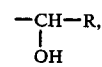

and
R is an alkyl radical;

Resin compounds of formula (6) can be produced by any convenient procedure as those skilled in the art will appreciate. For example, rules for the synthesis of resins from hydroxymethylene substituted bisphenols and epichlorohydrin condensates, but without terminating epoxide groups may be looked up in the DE-OS No. 32 30 560 A1.

In formula (6), R is preferably a lower alkyl radical. By the term "lower" reference is had herein to a radical which contains less than seven carbon atoms.

In a further development of the present invention, a polymer of the present invention can also be present as a co-condensate. Thus, a polymer having at least two reactive hydroxyl groups, such as, for example, a polymer of formula (6) above, is combined with a polymer having less than two reactive hydroxyl groups per molecule. For example, a polymer of formula (1) above.

Another presently preferred class of resins of the present invention comprises the class of resin compounds of formula (6) above wherein preferably substantially each of the 2–5 hydroxyl groups in each repeating unit present has been replaced by (reacted with) a substituted carboxyl radical through reaction with a carboxylic acid halide compound which contains a light sensitive group. After such reaction, the resulting resin is cross-linked by irradiation, and, after irradiation, the resin is cross-linked and thermostable. For example, such a light sensitive group can be a chalcone group, a group in which a double bond between two carbon atoms exists which can be cross-linked by light, or the like. Illustrative such compounds include the above described cinnamoyl chloride and furfuryl acryloyl chloride. Such product resin compounds are light-sensitive. Such a class of light sensitive resin compounds is difficult to represent by a simple structural formula.

More preferred embodiments of such light sensitive resin compounds made with the illustrated carboxylic acid halide compounds are (a) reaction products of a formula (6) resin compound with furfuryl acrylic acid halide, and (b) reaction products of a formula (6) resin compound with cinnamic acid chloride.

Presently, most preferred embodiments of such light sensitive resin compounds are those made by reaction of a formula (2) resin compound with furfuryl acryloyl chloride or cinnamoyl chloride.

In general, the reaction of such a resin compound of formula (6) with such a carboxylic acid halide compound which contains a light sensitive group is usually conveniently carried out under liquid phase conditions as described by J. March "Advanced Organic Chemistry" 2nd Edition, McGraw-Hill, 1977, p. 361.

The following advantages over known polymer systems are achieved with the class of polymers of the present invention:

1. Since more double bonds are available for cross-linking, and such double bonds are at a shorter distance from one another than in the known compounds, the exposure time for cross-linking is considerably shortened. For the exemplary embodiment of resin compound (1), this means a reduction in exposure time to about one-fifth of the previous value.
2. Due to the high steric hindrance, the glass transition temperature rises noticeably in comparision to previous resins; advantages in the thermal stability of an intensive resin are thereby achieved. A change in the dielectric constant of an inventive resin does not occur which is important when such a resin is to be used in printed circuit board manufacture. A low dielectric constant (Dk) is essential for the fabrication of small structures. A Dk of about 3, for example, allows interconnect spacings of about 20 $\mu$m.

(b) Compounding and Usage

In the sense of this invention, all terminating epoxide groups as well as all hydroxyl groups are reacted with radiation sensitive compounds prior to exposure to irradiation. So, thermal curing after appropriate irradiation exposure and cross-linking will not achieve chemical reactions. It is thus in a further sense of the invention to simplify photolithographic processes by dropping the need to use thermal curing agents and therefore the need to have thermosetting processes. Especially in the production of printed multi-layer circuits, the importance of the latter is clearly to be understood.

Those skilled in the art will appreciate that the light-sensitive resins of this invention can be admixed, if desired, with sensitizers which reduce exposure time, permit use of relatively low output light sources for imaging, or the like. It is preferable to avoid use of monomolecular stabilizers, sensitizers, or the like when it is desired to avoid the presence of monomolecular impurities in a cross-linked resin, particularly at relatively high concentration levels.

It is sometimes convenient to add an organic liquid diluent or solvent to a formulation to be applied on a photo resist layer or the like, depending upon such factors as the particular method to be employed for applying such a formulation to a copper foil surface, or the like. Examples of application methods include spraying, dipping, and the like.

After application to a chosen substrate surface, a photo resist layer comprised of a light-sensitive resin composition is dried.

In use, such a layer is covered with an appropriate mask, and exposed to light to accomplish imaging. The exposure can be carried out with any convenient light radiation source, such as sunlight, carbon arc lamps, xenon lamps, mercury high pressure lamps, metal halide lamps, and the like. Energy outputs ranging from, for example, 10 to 10,000 watts, typically 500–5000 watts are usable, with exposure time ranging from a few seconds to 15 minutes or longer. Exposure distances can range from about 5 to 10 centimeters if desired.

Thereafter, the imaged (exposed) layer is developed. Development can be accomplished, for example, with a developer in the case of a negative lacquer or with eluting of exposed areas in the case of a positive lacquer (leaving the unexposed areas as an etching resist in a subsequent process, for instance).

A developing liquid is conveniently an organic solvent or solvent mixture which, in the case of a negative lacquer, functions to dissolve the unexposed layer, but not the exposed plastics layer, as is known. Examples of suitable such liquids include dimethyl formamide, dimethyl-sulfoxide, glycol monoethyl ether, diglycol monoethyl ether, ethyl glycol acetate, trimethyl cyclohexanone, cyclohexanone, acetone, toluene, xylene, trichloroethylene, mixtures thereof, and the like.

(c) Production of Printed Multi-Layer Circuits

In making printed multi-layer circuits, copper-laminated prepregs or thin film laminates are typically utilized as indicated. Copper, as the etchable metal layer on the carrier materials is preferred, especially electrolytic copper foils of highest purity in various thicknesses for lamination, typical thicknesses being in the range from about 10 to 500 $\mu$m.

Convenient carrier materials are preferably epoxy resin impregnated sheets or fabrics.

Conventional metal etching fluids include ferric chloride solutions, ammonium persulfate solutions, and the like.

The use of the polymer system of the present invention in the manufacture of a multilayer wiring structure is described below with reference to an exemplary embodiment. Due to the characteristics of such a system, a new format results for an insulating carrier having electrical interconnects and electrical through-platings.

Referring to FIG. 1, there is seen a copper foil 1 which is employed as a carrier onto which an insulation layer 2 is applied by spray lacquering or the like. Layer 2 is sometimes called a photo resist layer and is here comprised of a photo responsive cross-linkable polymer composition of the present invention which can have additives admixed therewith, such as for example, Michler's ketone as a sensitizer. Layer 2 typically has a thickness remaining from about 5 to 20 μm (microns). The layer 2 is imaged with a light exposure, and then is developed in such a fashion that the desired through-platings to be inserted into it, that is, the connection points for the microcircuit chips, arise as passages 3 extending through the insulator layer 2. The irradiation of the layer 2 is carried out utilizing a mask (not shown) that covers the regions of each of the passages 3 of the layer 2 (negative lacquer). The covered regions (3) are subsequently removed with a solvent wash, but, because a chemical cross-linking has occurred in the exposed portions 13 of the layer 2 which prevents dissolution by the solvent wash, these portions 13 remain as an insulating layer. After such production of the passages 3 in this first insulating layer 2 (which is now comprised of the residual portions 13), the passages 3 are filled with a material having good electrical conductivity, for example, copper 23 (as shown in FIG. 2), in combination with the underlying copper foil 1, which serves as a carrier, such a filling thereof being conveniently accomplished by means of electroplating.

Referring to FIG. 2, it is seen that a further layer 4 which is here illustratively comprised of the same photo responsive cross-linkable insulating composition as employed in layer 2 is subsequently applied over the insulating layer residual portions 13 containing the through-plating passages 3. Layer 4 is processed in a similar fashion as above described in reference to FIG. 1 for layer 2. The interconnects 5 and further throughplating passages 6 are thus incorporated thereinto. The exposure and development of the layer 4 likewise processes in the same fashion as described in reference to FIG. 1. In addition to the passages 6 which are congruent with the passages 3 of the first insulating layer residual portions 13, trough-like recesses 5 for desired interconnects are here also illustratively produced in the second insulating layer 4. These recesses 5 are so positioned that at least one copper plating 23 in the first insulating layer residual portions 13 projects into each recess 5. For building up the interconnects, the recesses 5 are each provided with a metallization by means of electroplating. Further through-platings and interconnects can then be applied by means of an appropriate repetition of the manufacturing stages described above.

In comparison to known (prior art) systems, the above described new wiring format has the advantages not only of needing a significantly shorter exposure time, but also of requiring no intermediate or final temperings which cause production of by-product decomposition products that may alter the final structure. The employment of additional protective and adhesive films, as disclosed, for example, in the DE-PS No. 23 42 407, is likewise superfluous. Not only is the present method for manufacturing such a structure simplified by comparison to the prior art, but also the product structure has greater reliability with respect to the desired electrical characteristics.

For such reasons, especially the far shorter exposure time, the polymer system of the present invention is optimally further suited for use in formulating a high-temperature-resistant negative lacquer which is adapted for use in the manufacture of integrated semiconductor circuits in VLSI technology, where the production of dimensionally true microstructures, or, alternatively, of micropatterns, is of great significance. The process details of such a production according to the prior art may be derived from an article by C. D. Eisenbach in the periodical "Die angewandte Makromolekulare Chemie" 109/110 (1982) on pages 101 through 112.

The Eisenbach article describes common lithographic techniques used in very large scale integration (VLSI) circuit technology. A semiconductor device is coated with a layer of a light sensitive resin (photoresist). Then the layer is imaged through a mask, having a negative image of the structure to be produced. This may be carried out by UV-light, X-rays, electron, or ionbeamtechnique. The irradiation causes decreasing solubility in the imaged portions of the resin layer by photoinduced chemical modification. Unimaged portions of the layer are then dissolved away in an organic solvent to leave the residual structure of the imaged portions of said layer. A resin, which produces a negative image of a mask by irradiating a layer of the resin through the mask is called a negative resist. But also positive lithographic techniques are possible using a resin which shows an increasing solubility after irradiation. After developing, portions of the unexposed resist result.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE 1

Disodium-2,2',6,6; -tetra(hydroxymethyl)-4,4'-isopropylydenediphenolate (C.A. 43165-37-3) (BPAF)

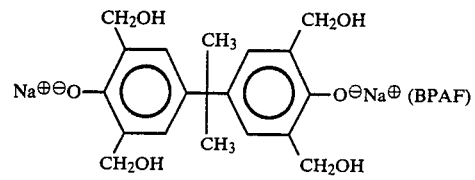

88 g NaOH and 228.3 g bisphenol A were dissolved in 650 ml distilled water under a nitrogen atmosphere in a two-necked flask. Then 144 g of paraformaldehyde were added. This mixture was stirred at room temperature for 48 hrs. After addition of 770 ml acetone the product, a slightly yellow powder was isolated by spray drying with a yield of more than 98%. All analytical data support the structure given above.

The degree of hydroxylation was easily controllable by the ratio bisphenol A and paraformaldehyde and the reaction time. The progress of reaction was followed by thin layer chromatography.

EXAMPLE 2

A 2 l two-necked flask was filled with 392 g BPAF, 875 ml distilled water and 400 ml acetone. Then 77.6 ml epichlorohydrin was added. After stirring for 8 hours at 40° C. the reaction product was isolated by spray drying, yielding an orange colored powder, which is soluble in ethanol and dimethylsulfoxide (DMSO). The yield is higher than 95%. All analytical data support the expected structure (formula 2—hydroxymethyl—modified epoxy resin).

EXAMPLE 3

78 g BPAF and 68 g of diglycidylether of bisphenol A were dissolved in 400 ml of DMSO. After addition of a solution of 8 g conc. HCL in 72 g distilled water the clear solution was heated from 40°–60° C. in 20 minutes, then it was kept at 60° C. for further 3 hours. After dilution with 500 ml methanol the product was isolated by spray drying. For further cleaning the yellow powder was washed with 3×300 ml cold water and with 3×200 ml ether. The product was dried in the vacuum oven. The yield is higher than 95%. All analytical data support the expected structure.

EXAMPLE 4

10 g of the hydroxylated epoxy resin were dissolved in 300 ml pyridine and 35 g cinnamoyl chloride were added. The reaction mixture was stirred and heated to 60° C. and kept at this temperature for 6 hours. The product was precipitated by adding of 500 ml diluted HCl. Then the product was washed with a second portion of diluted HCl and with a saturated solution of sodium carbonate in water (2×500 ml). The product was reprecipitated from acetone/2-propanol and then dried. The yellow-brown powder is soluble in acetone, toluene, xylene, acetic acid, ethyl ether and DMSO. The yield is quantitative. All analytical data support a complete esterification of the starting material. This procedure works also with furfuryl acryloyl chloride instead of cinnamoyl chloride.

As is apparent from the foregoing specification, the invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim:

1. A method for the manufacture of a printed multi-layer circuit employing an irradiation crosslinkable thermostable polymer, said method comprising the steps of:
   (a) coating a metal foil with a first layer comprised of an irradiation cross-linkable thermostable polymer, which is produced by reaction of a polycondensate of a bisphenol and epichlorohydrin, having at least two reactive hydroxyl groups present per each polymer repeating unit and which condensate ends with epoxide groups, with a compound having a light responsive group, wherein all hydroxyl groups as well as all terminating epoxide groups of said polycondensate are reacted with said compounds having a light responsive group;
   (b) generating a desired wiring structure in said first layer by exposing and developing in said first layer;
   (c) reinforcing exposed metal in said resulting first layer by electroplating; and
   (d) interposing at least one additional such layer over such first layer and repeating successively said steps (b) and (c) for each layer.

2. A method for generating a lacquer structure of the type employed in the manufacture of integrated semiconductor circuits in very large scale integration (VLSI) technology to serve as a mask in a process, wherein the surface of a semiconductor circuit is structured by selective etching and wherein the radiation crosslinkable polymer employed for building up said lacquer structure is produced by a polycondensate of a bisphenol and epichlorohydrin reacting with a compound having a light responsive group, the polycondensate having the structural formula:

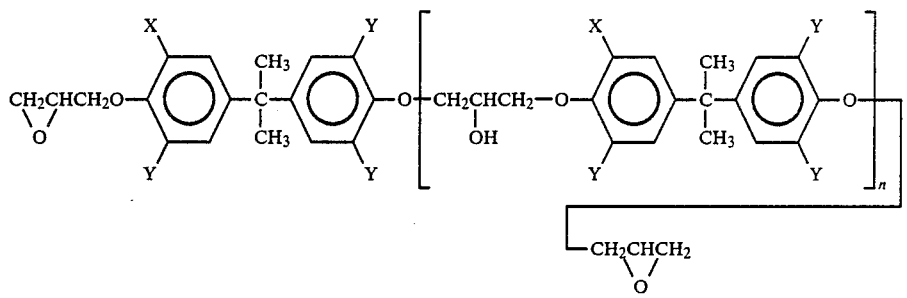

where:
n is a positive whole number which ranges from 0 to about 30,
X is a radical selected from the group consisting of hydroxymethylene and radicals of the structure:

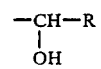

R is a lower alkyl radical
Y is a radical selected from the group consisting of hydrogen, hydroxy-methylene, and radicals of the structure

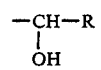

and wherein all said hydroxyl groups react with said compound, selected from the group consisting of cinnamoylchloride and furfurylacryloylchloride, the method comprising the steps of:
   (a) depositing a layer of said polymer on a semiconductor device;
   (b) imaging said layer through a mask; and
   (c) dissolving away all unimaged portions of said so imaged layer.

3. In a process for making a printed multi-layer circuit of the type where an electrically conductive metal layer is coated with a light-sensitive layer, and said layer is imaged through a mask having a negative image of the circuit pathways to be produced, and the so imaged layer is then developed with an organic solvent whereby unimaged portions of said so imaged layer are dissolved away, and whereby the residual portions of said so imaged and developed layer are thermally stable without post cure, the improvement comprises employing as said light-sensitive layer a radiation cross-linkable polymer produced by the reaction of a polycondensate reacting with a compound having a light responsive group, the polycondensate having the structural formula:

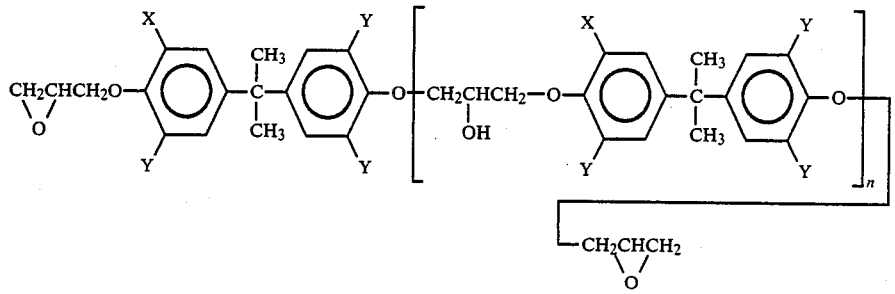

where:
n is a positive whole number which ranges from 0 to about 30,
X is a radical selected from the group consisting of hydroxymethylene and radicals of the structure:

$$-\underset{\underset{OH}{|}}{CH}-R$$

R is a lower alkyl radical
Y is a radical selected from the group consisting of hydrogen, hydroxy-methylene, and radicals of the structure $$-\underset{\underset{OH}{|}}{CH}-R$$

and wherein all said hydroxyl groups react with said compound having a light responsive group, selected from the group consisting of cinnamoylchloride and furfurlacryloylchloride.

* * * * *